(12) United States Patent
Yang

(10) Patent No.: US 6,555,275 B2
(45) Date of Patent: Apr. 29, 2003

(54) TECHNIQUE OF EXPOSING A RESIST USING ELECTRON BEAMS HAVING DIFFERENT ACCELERATING VOLTAGES, AND METHOD OF MANUFACTURING A PHOTOMASK USING THE TECHNIQUE

(75) Inventor: Seung-hune Yang, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 100 days.

(21) Appl. No.: 09/805,211

(22) Filed: Mar. 14, 2001

(65) Prior Publication Data

US 2002/0042005 A1 Apr. 11, 2002

(30) Foreign Application Priority Data

Sep. 1, 2000 (KR) .......................... 2000-51525

(51) Int. Cl.$^7$ .............................. G03F 9/00; G03C 5/00
(52) U.S. Cl. ........................................... 430/5; 430/296
(58) Field of Search .......................... 430/5, 296, 312, 430/30; 438/942

(56) References Cited

U.S. PATENT DOCUMENTS 6,162,567 A * 12/2000 Watanabe ...................... 430/5

FOREIGN PATENT DOCUMENTS

| JP | 2191316 | 7/1990 |
| JP | 1994-0005624 | 11/1991 |
| JP | 93-10618 | 6/1993 |
| JP | 8-222501 | 8/1996 |

* cited by examiner

Primary Examiner—S. Rosasco
(74) Attorney, Agent, or Firm—Volentine Francos, PLLC

(57) ABSTRACT

A technique of exposing a resist with electron beams having different accelerating voltages is used in a method for manufacturing a photomask. In a first exposing step, an electron beam resist on a substrate is exposed with an electron beam having an accelerating voltage low enough to keep the electron beam resist from developing. In a second exposing step, the electron beam resist is exposed with an electron beam having a higher accelerating voltage. Through the first and second exposing steps, the electron beam resist absorbs an amount of energy greater than the threshold energy, i.e., enough energy to allow the photoresist to be developed. This technique is applied to a resist coating at least one of an opaque layer and a phase shift film form on a transparent substrate. After the resist is developed, the opaque layer and/or phase shift film is etched using the patterned resist as an etching mask. The technique can also be applied to the forming of test patterns used in producing data by which the dosages of the electron beams used to manufacture the photomask are selected. The use of the two electron beams in exposing the resist facilitates the production of a pattern having a high degree of resolution in a short amount of time.

11 Claims, 6 Drawing Sheets

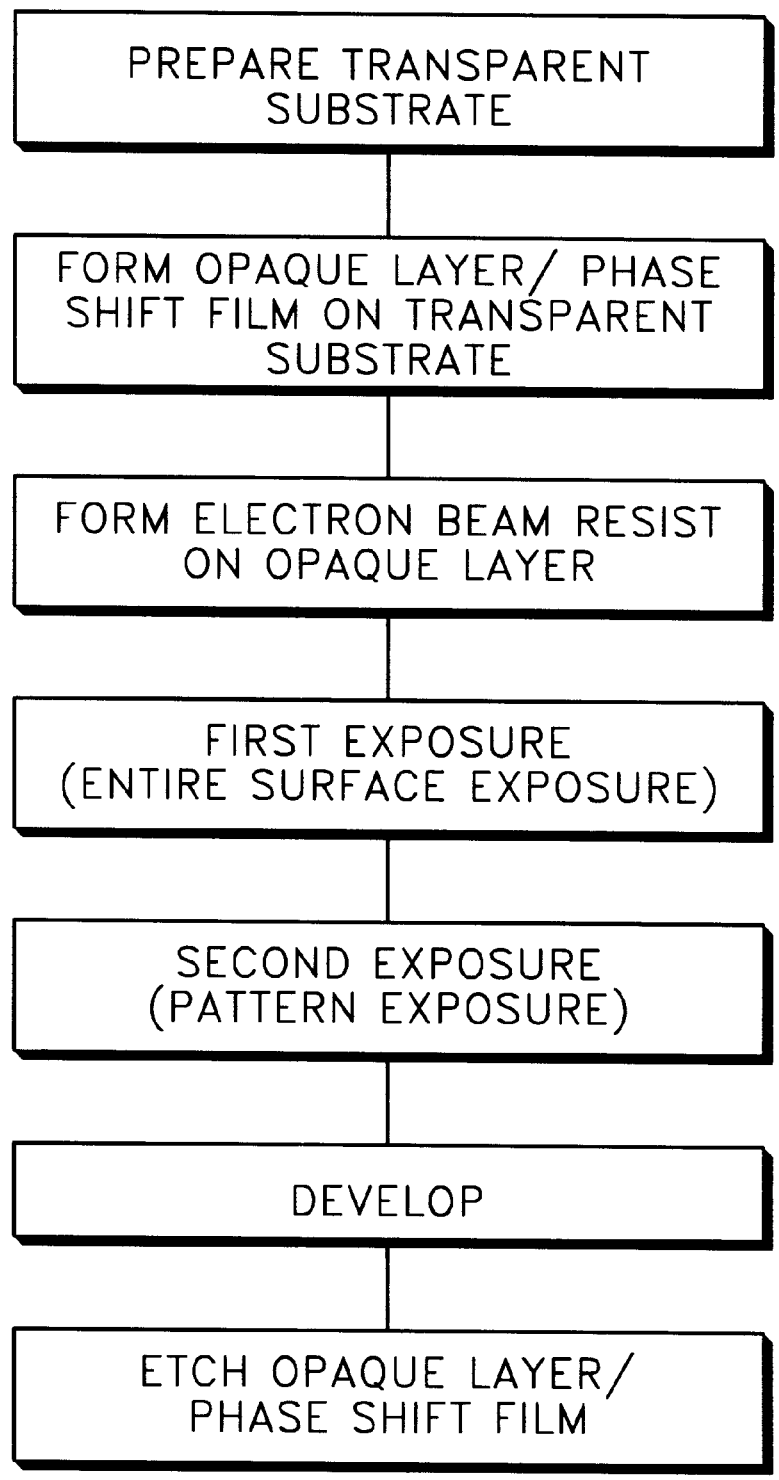

TECHNIQUE OF EXPOSING A RESIST USING ELECTRON BEAMS HAVING DIFFERENT ACCELERATING VOLTAGES, AND METHOD OF MANUFACTURING A PHOTOMASK USING THE TECHNIQUE

BACKGROUND OF THE INVENTION

1. Field of the Invention

The present invention relates to a photomask of a semiconductor device. More particularly, the present invention relates to a technique of exposing a resist with electrons and to a method of manufacturing a photomask using such a technique.

2. Description of the Related Art

An electron beam exposure process is typically used to manufacture photomasks. In this process, a layer of a predetermined material is formed over the entire surface of a substrate, the layer of material is coated with an electron beam resist, and then the resist is irradiated with an electron beam to form a desired pattern. The irradiated electron beam resist is developed to form an electron beam resist pattern. Then, the underlying layer of material is etched using the electron beam resist pattern as a mask, whereby a photomask having a desired pattern is produced.

As increases in the integration density of semiconductor devices are sought, the design rule for the devices becomes smaller. Thus, a critical dimension of the pattern of a photomask used in manufacturing semiconductor devices is also becoming smaller. Accordingly, efforts are being made to enhance the resolution of the electron beam-exposing device that is used to irradiate electron beam resists. These efforts have concentrated on raising the accelerating voltage of the electron beam in an attempt to reduce the range over which incident electrons are scattered. However, using an electron beam produced using a high accelerating voltage creates an unexpected problem. This problem will now be described with reference to FIGS. 1(A) and 1(B).

FIG. 1(A) illustrates the behavior of an electron beam 103 incident upon a photomask substrate 100 having a common opaque layer 101 and an electron beam resist 102. The hatched portion 106 of the electron beam resist 102 is to be exposed. Electrons 104 incident upon the electron beam resist scatter at various points in the electron beam resist, i.e. in the midst of the resist and at the interface between the resist 106 and opaque layer 102, resulting in decreases in their energy. Some of the energy of the scattered electrons is absorbed in a region of the electron beam resist 102 outside of the region 106 to be exposed.

FIG. 1(B) illustrates a distribution of the absorption energy, which distribution results from the scattering of the incident electrons. The incident electrons of an electron beam having a low accelerating voltage 111 are scattered over a wide range. Thus, the absorption energy is also distributed over a wide region. However, the electrons of an electron beam having a high accelerating voltage 112 are scattered over a very narrow range. Although the absorption energy is distributed over a very narrow region, the electrons tend to penetrate the photomask substrate 100 completely rather than being scattered in the electron beam resist. Therefore, only a small proportion of the total energy of the beam is absorbed at the electron beam resist. For example, a typical dose of radiation provided by an exposing device having an accelerating voltage of 10 keV is 8 $\mu$C. However, in comparison, an exposing device having an accelerating voltage of 50 keV must provide a dose of radiation of 32 $\mu$C and over a much longer exposing time to produce the same amount of absorbed energy in a comparable resist than the exposing device having an accelerating voltage of 10 keV. Therefore, although photomasks having small critical dimensions can be manufactured by an exposing device that generates electron beams having a high accelerating voltage, the use of such a device compromises the productivity of the manufacturing process.

SUMMARY OF THE INVENTION

An object of the present invention is to solve the above-described problem by providing a technique by which a pattern of a photomask having a high degree of resolution can be produced in a short time.

To achieve the above object, the present invention provides a method in which an electron beam resist is exposed (patterned) with electron beams having low and high accelerating voltages, respectively. The step of exposing the electron beam resist to the electron beam having the low accelerating voltage causes the resist to absorb an amount of energy less than the threshold energy of the resist. The energy is nonetheless absorbed quickly because the electrons do not penetrate the resist completely so as to scatter. The electron beam resist is exposed with the electron beam having a high accelerating voltage to provide the high degree of resolution of the pattern formed on the resist. The electron beam resist can be exposed to the electron beams in any order.

This technique can be applied directly to the method of manufacturing a photomask, according to the present invention. In this case, a phase shift film and/or an opaque layer is formed on a transparent substrate, and the electron beam resist is coated on the phase shift film and/or the opaque layer. The electron beam resist is then exposed by a first electron beam and by a second electron beam having a higher accelerating voltage than that of the first electron beam, whereby a desired pattern is formed. The electron beam resist is then developed to produce an electron beam resist pattern. Next, the phase shift film and/or the opaque layer are etched using the electron beam resist pattern as an etching mask, whereby a photomask having a desired pattern is manufactured.

The technique can also be applied indirectly to the method of manufacturing a photomask, according to the present invention. Specifically, several test electron beam resists are produced, and a test pattern is reproduced on each of the test electron beam resists using the above-describe technique. The test electron beam resists are then developed to form test electron beam resist patterns. Data representative of characteristics of the test electron beam resist patterns is then generated. For instance, a critical dimension of each of the electron beam resist patterns is measured.

Appropriate dosages of the first and second electron beams for use in patterning the resist of the photomask are selected, based on the data, from among those used to form the test electron beam resist patterns.

BRIEF DESCRIPTION OF THE DRAWINGS

The above objects, features and advantages of the present invention will become more apparent from the following detailed description of the preferred embodiments thereof made with reference to the attached drawings, of which:

FIG. 2 is a flowchart of the preferred embodiment of a method manufacturing a photomask according to the present invention;

DETAILED DESCRIPTION OF THE PREFERRED EMBODIMENTS

The present invention will now be described in greater detail with reference to FIGS. 2–7B.

Referring first to FIG. 2, a transparent substrate is provided for use as the substrate of the photomask. A glass or quartz substrate is usually used as the transparent substrate. Next, an opaque layer is formed on the transparent substrate. Chromium is usually used as the opaque material. As occasion demands, a phase shift film of a material such as MoSiON can be formed above or below the opaque layer, or instead of the opaque layer if the object is to manufacture a phase shift mask. The opaque material and/or the material of the phase shift film can be deposited on the substrate by sputtering or chemical vapor deposition. Then, an electron beam resist is formed on the opaque layer. The electron beam resist can be a negative type or a positive type of resist—the exposed portion of a positive type of resist is removed by the developing process, whereas the exposed portion of a negative type of resist is left on the substrate by the developing process, to form a pattern.

Still referring to FIG. 2, the electron beam resist is then exposed (irradiated with electrons). The exposing of the electron beam resist comprises a first step of exposing the resist with an electron beam having a low accelerating voltage and a second step of exposing the resist with an electron beam having a higher accelerating voltage. In the first exposing step, the entire surface of the electron beam resist is exposed with an electron beam (this will be referred to hereinafter as "entire surface exposure"). However, in the first exposing step, the electron beam resist can instead be exposed in a predetermined pattern corresponding to that which is desired to be formed in a layer of material (for example, the opaque layer) by a subsequent etching process (this will be referred to hereinafter as "pattern exposure").

More specifically, the first exposing step comprises irradiating the resist with an electron beam having a relatively low voltage, for example, 10, 20, or 30 keV, and the second exposing step comprises irradiating the resist with an electron beam having a high accelerating voltage, for example, 50 keV or higher. Therefore, the rate at which energy is absorbed by the electron beam resist during the first exposing step is greater than the rate at which energy is absorbed during the second exposing step. However, the amount of energy absorbed during the first exposing step, which amount is dependent on the dosage of the electron beam and the exposure time, is regulated to such a level that the electron beam resist would not develop if subjected thereafter to the developing process. The second exposing step comprises pattern exposure and provides enough energy to cause the resist to develop when subjected to the developing process.

Figure 1A:
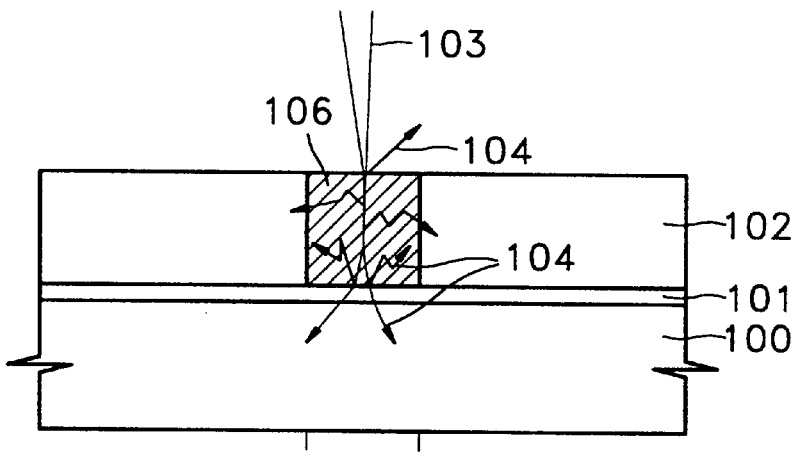
FIG. 1A is a sectional view of a substrate, illustrating the behavior of an electron beam incident upon an electron beam resist.
Figure 1B:
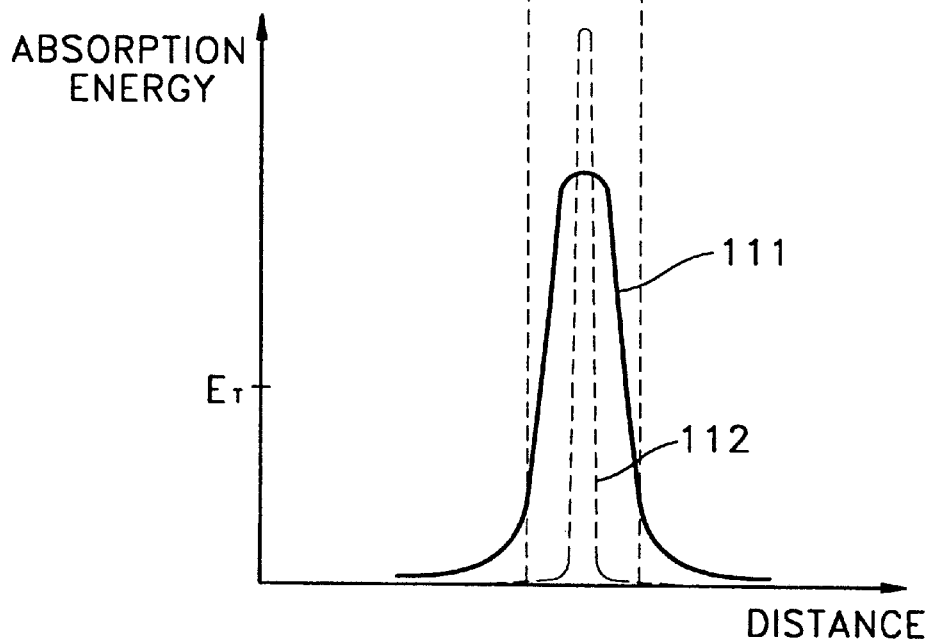
FIG. 1B is a graph showing the distribution of absorbed energy according to the accelerating voltage of the incident electron beam.
Figure 3A:
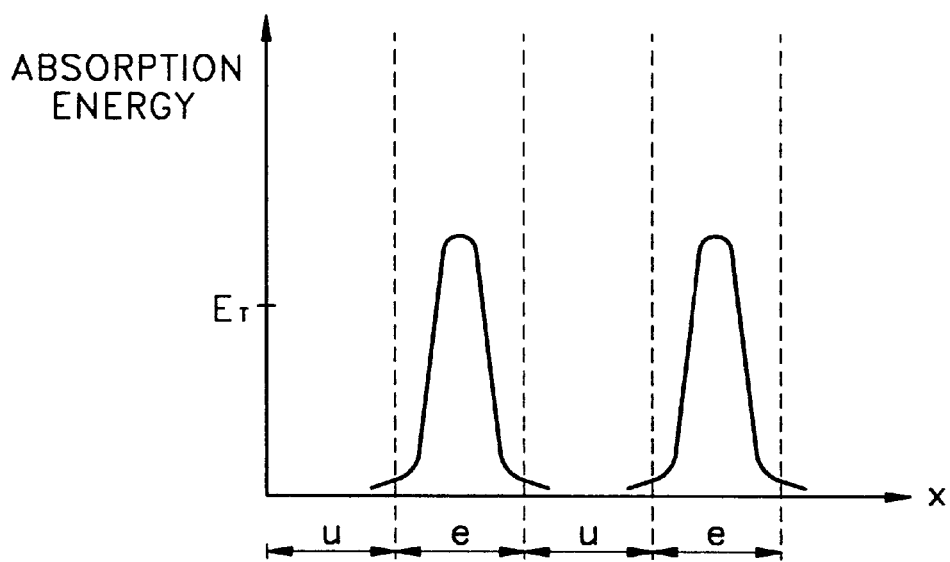
FIGS. 3A and 3B are conceptional diagrams, respectively, of the absorption energy produced as the result of a conventional one-step exposure process and of the absorption energy produced as the result of the two-step exposure process according to the present invention.
Figure 3B:
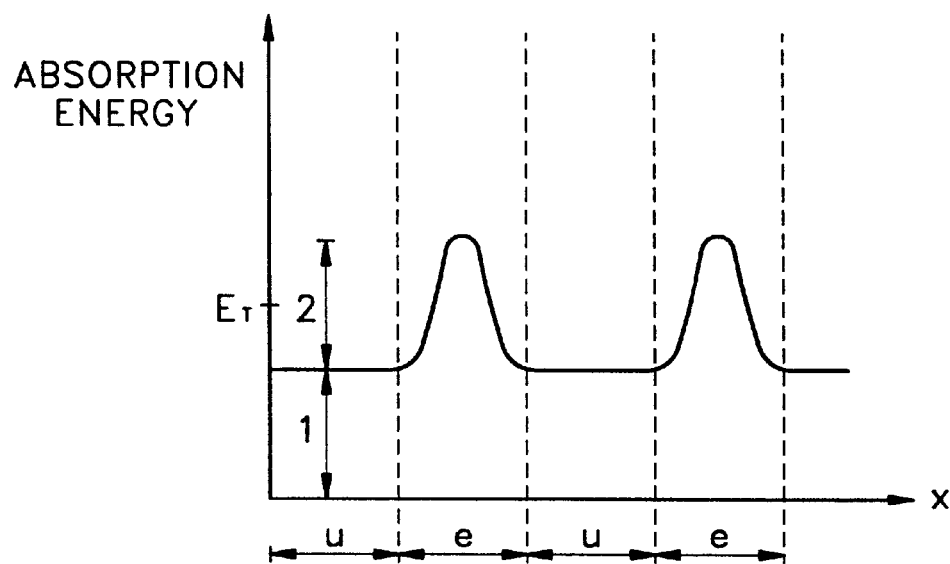

Referring now to FIGS. 3A and 3B, reference symbol "e" along the x-axis of the figures represents an exposed portion of a resist, i.e., the portion of the resist irradiated by an electron beam, and reference symbol "u" represents the unexposed portion. As shown in FIG. 3A, energy is absorbed mainly in the exposed portion "e" of an electron beam resist that has been subjected to the conventional one-step exposure process. However, as shown in FIG. 3B, when the electron beam resist is subjected to the two-step exposure process of the present invention, the total energy absorbed by the electron beam resist is the sum of the background energy 1 absorbed during the first exposing step, and the peak energy 2 absorbed during the second exposing step.

As was previously described in connection with the prior art, an electron beam of a high accelerating voltage can produce a resist pattern with a high degree of resolution because the electrons of such a beam scatter within a very narrow range around the irradiated region of the resist. On the other hand, only a small of energy is absorbed by the electron beam resist because most of the radiation passes through the electron beam resist.

The method of the present invention first exposes the electron beam resist to an electron beam of a low accelerating voltage so that a large amount of energy is absorbed, and then to an electron beam of a high accelerating voltage. In comparing the present invention to the prior art, a pattern having a similarly high resolution can be obtained in less (exposure) time.

As was also mentioned above, the amount of background energy 1 absorbed as a result of the first exposing step must not be enough to actually form a pattern in the electron beam resist. That is, it must be sufficiently lower than the threshold energy ($E_T$) of the electron beam resist. As long as this condition is satisfied, the total energy absorbed by the electron beam resist is the arithmetical sum of the background energy 1 absorbed as the result of the first exposing step and the peak energy 2 absorbed as the result of the second exposing step. Therefore, the order in which the first and second exposing steps are performed does not matter. Also, the first exposing step can perform a pattern exposure instead of an entire surface exposure. Incidentally, a Mebes raster-scan type of exposing device manufactured by Etec and producing an electron beam having an accelerating voltage of 10 keV, and an EBM-3000 vector-scan type of exposing device manufactured by Toshiba and producing an electron beam having an accelerating voltage of 50 keV, were used in the preferred embodiment.

Referring back to FIG. 2, the exposed electron beam resist is developed with a developing solution to form an electron beam resist pattern. Then, the opaque layer and/or phase shift film below the electron beam resist is etched using the electron beam resist pattern as an etching mask, whereupon the photomask is completed. The type of developing process and etching process employed depend on the materials of the electron beam resist, the opaque layer and/or the phase shift film. Such processes per se are well known to those skilled in the art and therefore, will not be described here in detail.

Hereinafter, a method of determining the dosages of the electron beams used to perform the two-step exposing process of the present invention, will be described with reference to FIGS. 4 through 6.

Figure 4:
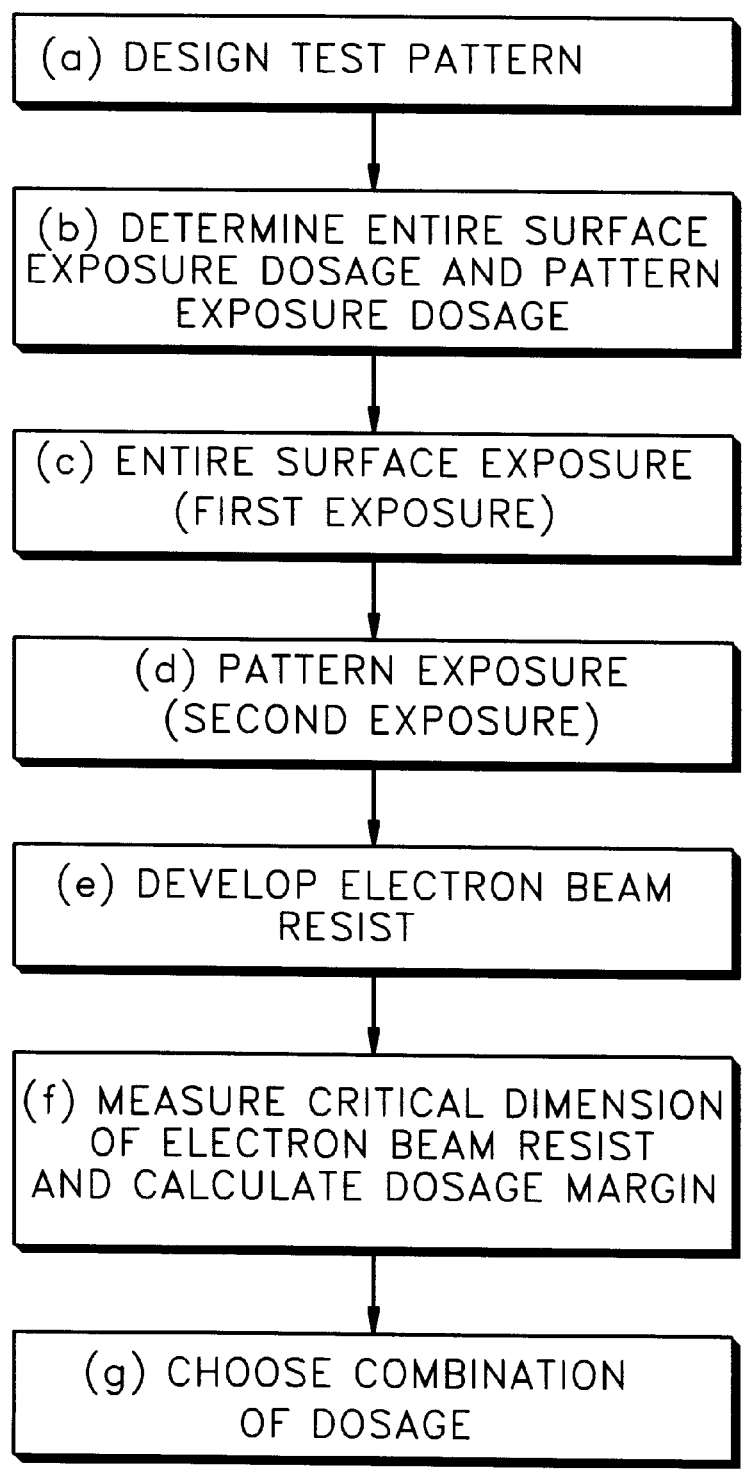
FIG. 4 is a flowchart of steps used to determine the electron beam dosage according to the present invention.

Referring to FIG. 4, a test pattern is designed (step (a)). The test pattern 210 is illustrated in detail in FIG. 5. The test pattern 210 includes a standard pattern region B, comparative pattern regions A and C, and a region D having no pattern. The standard pattern region B and the comparative pattern regions A and C respectively have a standard pattern 230 and comparative patterns 231 and 232 having a plurality of specific critical dimensions 240. The region D in which no pattern is formed is a region in which an entire surface exposure will be performed by an electron beam having a low accelerating voltage. The patterns 230, 231 and 232 of regions A, B, and C are to be formed by first and second exposing steps. More specifically, regions A, B, and C of an electron beam resist will be irradiated by electron beams having low and high accelerating voltages, respectively, and then the irradiated portions of the electron beam resist will be removed (positive type) or left in place (negative type) by the developing process so that the patterns 230, 231 and 232 will be formed. The critical dimensions of the patterns will be measured against the dosages that were used in creating them to determine the dosages that should be used in manufacturing the photomasks used for manufacturing actual semiconductor devices. The comparative patterns 231 and 232 will be produced by dosages respectively corresponding to 90% and 110% of the dosage used in producing the standard pattern (namely, the dosage of the second exposing step). In this embodiment, the critical dimension 240 of the standard pattern and of the comparative patterns was designed to 1 μm.

Referring again to FIG. 4, after the test pattern is designed in step (a), dosages for creating a series of the test patterns are determined. Specifically, dosages for performing entire surface exposures and pattern exposures, to create a standard pattern region B, comparative pattern regions A and C, and a region D having no pattern in each of a plurality of test patterns, are determined (step (b)). In the preferred embodiment, among the test patterns the dosages determined for performing the entire surface exposures varied by amounts of 2 μC within a range of 2–10 μC, and the dosages determined for performing the pattern exposures varied by amounts of 2 μC within a range of 12–20 μC.

The number of test patterns corresponds to the number of possible combinations of entire surface exposure dosages and pattern exposure dosages within the given ranges. FIG. 6 illustrates such a collection of test patterns 210 that will be formed on a photomask substrate 200. In FIG. 6, the entire surface exposure dosages vary among the test patterns as shown along the x-axis, and the sum of the dosages (the sums of the entire surface exposure dosages and the pattern exposure dosages) vary among the test patterns as shown along the y-axis. The dosages shown represent those used in forming the standard patterns.

Figure 5:
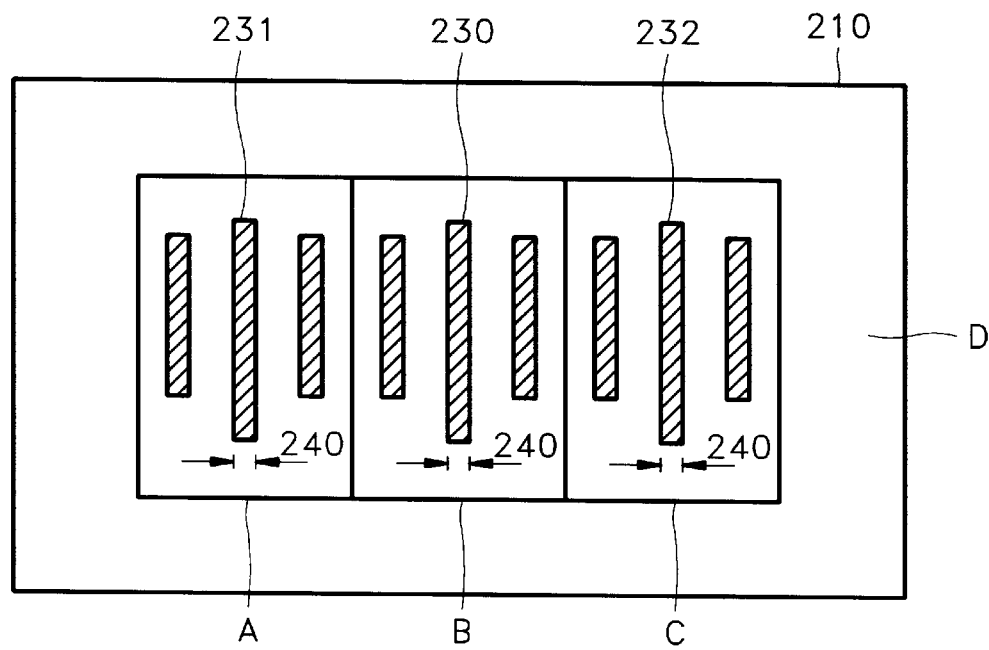
FIG. 5 is a plan view of a test pattern used in the preferred embodiment of the present invention.
Figure 6:
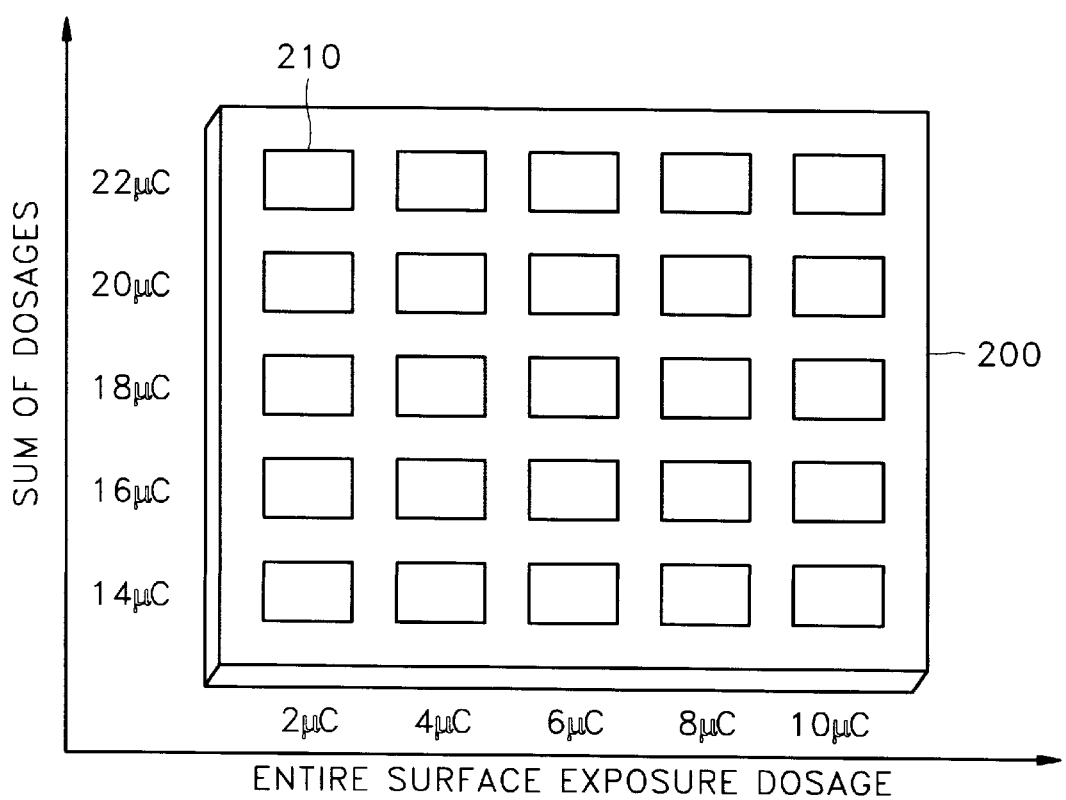
FIG. 6 is a conceptual diagram of an arrangement of test patterns used in establishing the dosages to which an electron beam resist is exposed in manufacturing a photomask according to the present invention.

Referring to FIGS. 4–6, electron beams are produced to form each of the test patterns. First, in (step c), the regions on which the test patterns are to be formed are irradiated (entire surface exposure) with the respective entire surface exposure dosages determined in step (b). Then, in step (d), the standard patterns 230 and the comparative patterns 231 and 232 of the test patterns are formed (pattern exposure) with the respective pattern exposure dosages that were also determined in step (b).

Still referring to FIG. 4, the exposed electron beam resist is developed to form the test patterns, namely electron beam resist patterns (step (e)). In the preferred embodiment, the electron beam resist was developed for 4 minutes and 30 seconds. In this case, no pattern was formed in any region where the sum of the dosages was equal to or less than 16 μC. Therefore, such region(s) were excluded from consideration in the following steps.

Subsequently, in a data generating step (step (f)), the critical dimensions of each electron beam resist pattern, corresponding to the standard pattern 230 and the comparative patterns 231 and 232 shown in FIG. 5, were measured. Also, dosages margins—for use in determining the operation parameters for forming the photomask—were calculated by inserting the values of the measured critical dimensions into the following formula.

$$\text{Dosage Margin} = \frac{\text{Difference of Critical Dimension Between Resist Patterns Corresponding to Comparative Patterns}}{\text{\% Dosage Difference Between Comparative Patterns}} \quad (1)$$

The "difference of the critical dimensions between the resist patterns corresponding to the comparative patterns" means the difference in the critical dimensions between the developed comparative (electron beam resist) pattern formed using a dosage 90% of that used to form the standard (electron beam resist) pattern 231 and the comparative (electron beam resist) pattern formed using a dosage 110% of that used to form the standard (electron beam resist) pattern 232. The "% dosage difference between the comparative patterns" refers to the difference in dosages in percent between that used to form the comparative (electron beam resist) pattern 231 and that used to form the comparative (electron beam resist) pattern 232. Thus, the % dosage difference of the preferred embodiments is 20.

Again referring to FIG. 4, dosages yielding a suitable critical dimension are chosen based on the results of these calculations (step g).

Hereinafter, an example of the decisions made in step (g) will be described with reference to FIGS. 7A and 7B. In these graphs, the plot designated by reference numeral 211 represents results from those test patterns (see FIG. 6) in which the sum of doses was 18 μC, the plot designated by reference numeral 212 represents results from those test patterns in which the sum of doses is 20 μC, and the plot designated by reference numeral 213 represents results from those test patterns in which the sum of doses is 22 μC. As was mentioned above, cases in which no pattern was formed during a developing process executed for 4 minutes and 30 seconds, that is the test patterns in which the sum of the doses was equal to or less than 16 μC, are excepted.

Figure 7A:
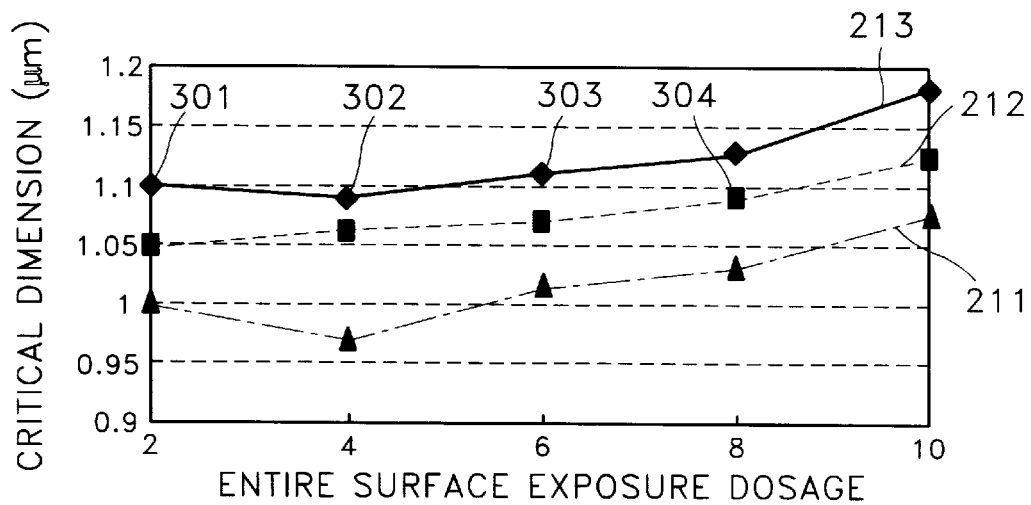
FIG. 7A illustrates a critical dimension of an electron beam resist pattern corresponding to a standard pattern with respect to a combination of each dose according to a preferred embodiment of the present invention.

FIG. 7A shows the measured critical dimensions of those electron beam resist patterns corresponding to the standard patterns. As previously mentioned, the critical dimension of the standard pattern was designed to be 1 μm. The selecting of appropriate dosages for the photomask manufacturing process depends on a determination of a proper target critical dimension. For example, a target critical dimension exceeding 10% of the designed critical dimension may be preferable. In this case, therefore, the standard patterns represented by reference numerals 301, 302, 303 and 304 had measured critical dimensions close to the target critical dimension of 1.1 µm.

Also, in these cases, the ratios of the entire surface exposure dosage to the pattern exposure dosage were (from FIG. 6): 2:20 (301), 4:18 (302), 6:16 (303), and 8:12 (304). However, in the case (301) in which the ratio of the dosages was 2:20, the entire surface exposure dosage is small, meaning that using the dosages to form such a pattern having the target critical dimension requires many hours of exposure time. Therefore, these dosages are ruled out in step (g) as a possible combination of dosages for use in manufacturing the photomask. However, in the other cases (302, 303, 304), the total exposure time required was only about 35 minutes. The exposure time required for the one-step pattern exposure using an electron beam having an accelerating voltage of 50 keV was about 52 minutes. Therefore, the dosages used to create the patterns of cases 302, 303, 304 can effect an increase in the manufacturing throughput by more than 30% compared to the conventional technique.

Figure 7B:
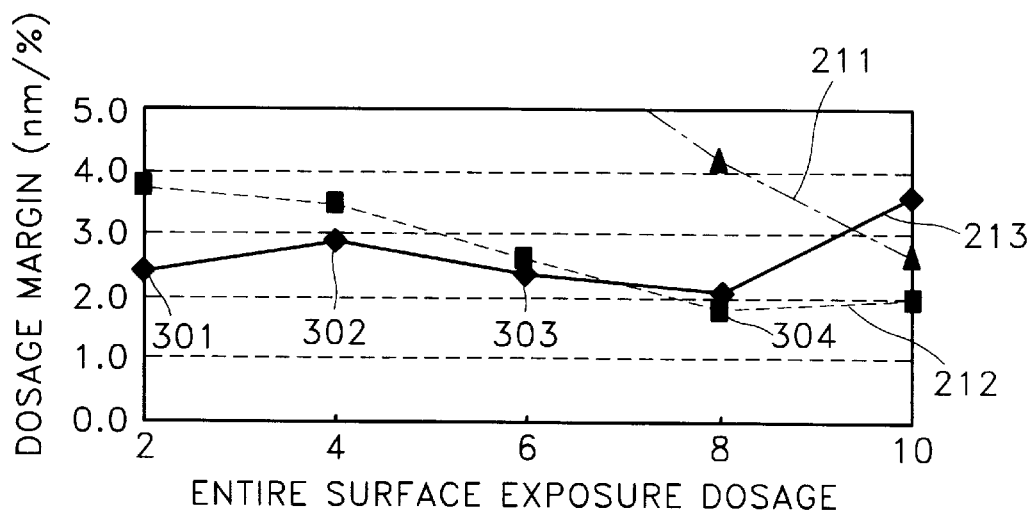
FIG. 7b illustrates a dose margin of a comparative pattern with respect to a combination of each dose according to a preferred embodiment of the present invention.

The three cases 302, 303, and 304 also have good dosage margins as illustrated in FIG. 7B. Referring to this figure, the cases in question have dosage margins of about 2–3 nm/%. These dosage margins are comparable to that yielded by performing pattern exposure only, using an exposing device having an accelerating voltage of 50 keV (about 2.4 nm/%).

Analyzing the data, shown in FIGS. 7A and 7B, in this way reveals that the ratio of the entire surface exposure dosage to the pattern exposure dosage is preferably within the range of about 1:1–1:5.

According to the present invention, a photomask having a pattern having high resolution can be produced in a short amount of time, because the electron beam having a low accelerating voltage provides a high rate energy absorptivity, while the electron beam having a high accelerating voltage provides the high degree of resolution.

Although the present invention has been described above in connection with the preferred embodiments thereof, various changes thereto and modifications thereof will become apparent to those skilled in the art. All such changes and modifications are seen to be within the true spirit and scope of the invention as defined by the appended claims.

What is claimed is:

1. A method of manufacturing a photomask, comprising:
   forming at least one of a phase shift film and an opaque layer on a transparent substrate;
   coating said at least one of the phase shift film and the opaque layer with an electron beam resist;
   exposing the electron beam resist to a first electron beam having an accelerating voltage so low and of such a dosage that the electron beam resist absorbs an amount of energy less than the threshold energy of the resist, the threshold energy being that necessary to cause the electron beam resist to develop when subjected to a developing process designated for use in developing the resist;
   exposing the electron beam resist to a second electron beam having an accelerating voltage greater than that of the first electron beam and of a dosage sufficient to cause the resist to absorb an amount of energy which, when added to the energy absorbed by the resist as the result of its exposure to the first electron beam, exceeds the threshold energy of the resist required for the resist to develop when subjected to said developing process;
   wherein at least one of the steps of exposing the electron beam resist to an electron beam comprises irradiating the resist in a pattern;
   subsequently developing the electron beam resist using said developing process, whereby selected portions of the resist corresponding to the pattern are removed, to thereby form an electron beam resist pattern; and
   subsequently etching said at least one of the phase shift film and the opaque layer, using the electron beam resist pattern as an etching mask.

2. The method of claim 1, wherein the exposing of the resist to the first electron beam comprises exposing of the resist to an electron beam having an accelerating voltage 35 keV.

3. The method of claim 1, wherein the exposing of the resist to the first electron beam comprises exposing the entire surface of the resist to the electron beam.

4. The method of claim 1, wherein a ratio of the dosage of the second electron beam to the dosage of the first electron beam is 1–5.

5. The method of claim 1, wherein the exposing of the resist to the first electron beam is performed before the resist is exposed to the second electron beam.

6. The method of claim 1, wherein the exposing of the resist to the second electron beam is performed before the resist is exposed to the first electron beam.

7. A method of manufacturing a photomask, comprising steps of:
   producing several test electron beam resists;
   designing a test pattern to be reproduced on each of the test electron beam resists;
   exposing each of the test electron beam resists to a first electron beam having an accelerating voltage so low and at such a dosage that the electron beam resist absorbs an amount of energy less than the threshold energy of the resist, the threshold energy being that necessary to cause the electron beam resist to develop when subjected to a developing process designated for use in developing the resist; and
   exposing each of the test electron beam resists to a second electron beam having an accelerating voltage greater than that of the first electron beam to which the test electron beam resist is exposed and at a dosage sufficient to cause the resist to absorb an amount of energy which, when added to the energy absorbed by the resist as the result of its exposure to the first electron beam, exceeds the threshold energy of the resist required for the resist to develop when subjected to said developing process;
   wherein at least one of the steps of exposing each of the test electron beam resists to an electron beam comprises irradiating the electron beam resist in said test pattern, and the intensity of at least one of the first and second electron beams to which the test electron beam resists are exposed is varied among the steps of exposing the test electron beam resists such that the sum of the dosages to which the test electron beam resists are exposed during said exposing varies from resist to resist;
   subsequently developing the test electron beam resists using said developing process to thereby form test electron beam resist patterns;
   generating data representative of characteristics of the test electron beam resist patterns;
   based on the data, selecting appropriate dosages of first and second electron beams, respectively, from among those used to form the test electron beam resist patterns;
   forming at least one of a phase shift film and an opaque layer on a transparent substrate;
   coating said at least one of the phase shift film and the opaque layer with an electron beam resist;

exposing the coating of electron beam resist to the dosages of the first and second electron beams selected as a result of the analysis of the test electron beam resist patterns;

developing the exposed coating of electron beam resist, to thereby form an electron beam resist pattern; and subsequently etching said at least one of the phase shift film and the opaque layer, using the electron beam resist pattern, formed thereon, as an etching mask.

8. The method of claim 7, wherein said step of producing several test beam resists comprises coating a plurality of discrete regions of a single transparent substrate with electron beam resist to form a plurality of discrete coated regions corresponding to said test electron beam resists, respectively.

9. The method of claim 7, wherein said step of exposing each of the test electron beam resists to a first electron beam comprises irradiating the entire surface of the test electron beam resist with the first electron beam, and said step of exposing each of the test electron beam resists to a second electron beam comprises irradiating the test electron beam resist in said test pattern.

10. The method of claim 9, wherein said step of generating data comprises measuring a critical dimension of each of the test electron beam resist patterns.

11. The method of claim 7, wherein said step of designing a test pattern comprises designing a standard test pattern and two comparative test patterns for reproduction on each of said test electron beam resists, the standard test pattern is produced on each of said test electron beam resists by exposing a region of the test electron beam resist to the first and second electron beams at a standard dosage, the comparative test patterns are produced on each of said test electron beam resists by exposing respective regions of the test electron beam resist to the first and second electron beams at dosages, respectively, less than and greater than the standard dosage, whereby said developing of the test electron beam resists forms electron beam resist patterns each having respective patterns corresponding to said standard and comparative test patterns, and said step of generating data comprises measuring critical dimensions of said patterns corresponding to said standard and comparative test patterns, respectively, for each of said electron beam resist patterns, and calculating a dosage margin for each of said electron beam resist patterns using values of the critical dimensions of the patterns corresponding to the comparative test patterns thereof.

* * * * *